(12) United States Patent
Matsushita et al.

(10) Patent No.: US 11,150,072 B2
(45) Date of Patent: Oct. 19, 2021

(54) DISPLACEMENT MEASURING DEVICE

(71) Applicant: MITUTOYO CORPORATION, Kawasaki (JP)

(72) Inventors: Masaki Matsushita, Kawasaki (JP); Satoshi Adachi, Yokohama (JP)

(73) Assignee: MITUTOYO CORPORATION, Kawasaki (JP)

( * ) Notice: Subject to any disclaimer, the term of this patent is extended or adjusted under 35 U.S.C. 154(b) by 0 days.

(21) Appl. No.: 17/063,533

(22) Filed: Oct. 5, 2020

(65) Prior Publication Data
US 2021/0102796 A1 Apr. 8, 2021

(30) Foreign Application Priority Data
Oct. 7, 2019 (JP) .............................. JP2019-184856

(51) Int. Cl.
*G01R 27/26* (2006.01)
*G01B 7/14* (2006.01)
(Continued)

(52) U.S. Cl.
CPC ............... *G01B 7/14* (2013.01); *G01B 7/003* (2013.01); *G01B 7/02* (2013.01); *G01B 7/023* (2013.01);
(Continued)

(58) Field of Classification Search
CPC .......... G01B 7/14; G01B 7/023; G01B 7/003; G01B 7/02; G01B 7/08; G01B 11/14; H03K 17/955; H03K 17/962; G01D 5/2417; G01D 5/2452; G01D 5/2415; G01D 5/2497; G01D 5/245
(Continued)

(56) References Cited

U.S. PATENT DOCUMENTS

| | | | |
|---|---|---|---|
| 2016/0209242 A1* | 7/2016 | Adachi | ................ G01D 5/2415 |
| 2019/0004565 A1* | 1/2019 | Nelson | ........................ G06F 1/12 |
| 2019/0007243 A1* | 1/2019 | Burbano | ................... H03K 7/04 |

FOREIGN PATENT DOCUMENTS

| | | |
|---|---|---|
| JP | H06-064100 | 8/1994 |
| JP | 2738996 | 4/1998 |

(Continued)

*Primary Examiner* — Raul J Rios Russo
(74) *Attorney, Agent, or Firm* — Rankin, Hill & Clark LLP

(57) ABSTRACT

There is provided a displacement measuring device that minimize unnecessary power consumption and improves power efficiency.

A displacement measuring device includes a main scale and a detection head that is provided in such a manner as to be relatively displaceable to the main scale and outputs a periodic signal having a phase to be changed according to relative displacement to the main scale.

The detection head outputs, as the periodic signal, a coarse scale signal having a coarse period and a fine scale signal having a fine period. A coarse phase detector calculates, from two pieces of phase information acquired from the coarse scale signal, the average phase of the coarse scale signal. A fine phase detector calculates, from four pieces of phase information acquired from the fine scale signal, the average phase of the fine scale signal. The coarse phase detector calculates the average phase of the coarse scale signal from the two pieces of phase information and, then, stops operating without the completion of the operation of the fine phase detector.

3 Claims, 12 Drawing Sheets

(51) Int. Cl.
   *G01D 5/241* (2006.01)
   *G01B 7/02* (2006.01)
   *G01B 7/00* (2006.01)
   *G01B 7/06* (2006.01)
   *G01B 11/14* (2006.01)
   *H03K 17/955* (2006.01)
   *H03K 17/96* (2006.01)

(52) U.S. Cl.
   CPC ................ *G01B 7/08* (2013.01); *G01B 11/14* (2013.01); *G01D 5/2417* (2013.01); *H03K 17/955* (2013.01); *H03K 17/962* (2013.01)

(58) Field of Classification Search
   USPC .......... 324/76.11–76.83, 459, 600, 649, 658, 324/661, 662
   See application file for complete search history.

(56) References Cited

FOREIGN PATENT DOCUMENTS

JP     2878913     4/1999
   JP     2909338     6/1999

\* cited by examiner

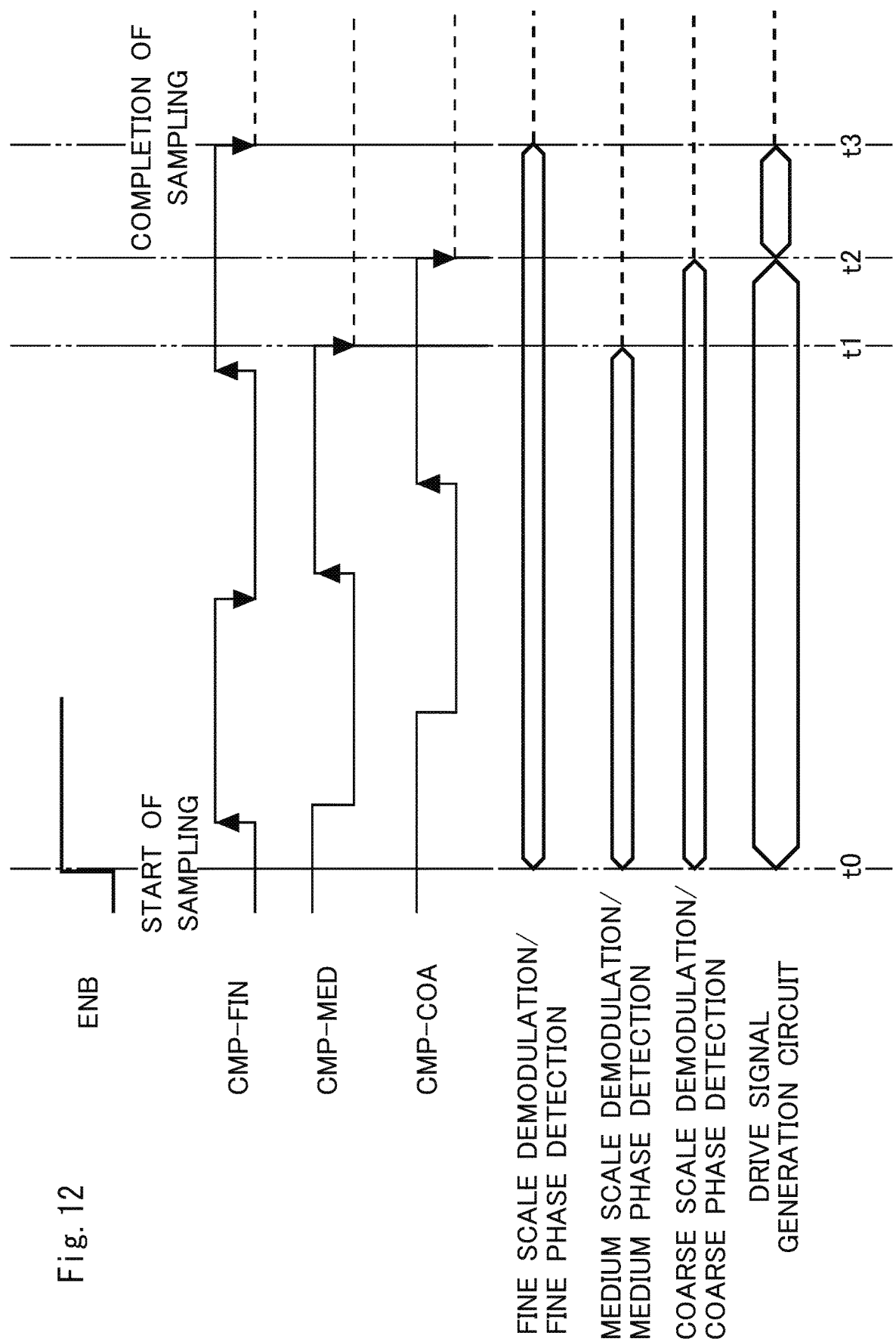

DISPLACEMENT MEASURING DEVICE

INCORPORATION BY REFERENCE

This application is based upon and claims the benefit of priority from Japanese patent application No. 2019-184856, filed on Oct. 7, 2019 (Priority DAS code: 777E), the disclosure of which are incorporated herein in its entirety by reference.

BACKGROUND OF THE INVENTION

1. Field of the Invention

The present invention relates to a displacement measuring device and a displacement measuring method. Specifically, the present invention relates to a technique for measuring relative displacement of a movable element to a fixed element based on a detection signal which changes according to the relative displacement.

2. Description of Related Art

There is a known displacement measuring device, which is called an encoder, that detects the displacement or the position of a movable element to a fixed element (for example, JPH 06-064100B, JP 2909338 B, JP 2878913 B, and JP 2738996 B). Encoders have been used for displacement detectors of small measuring devices, such as digital vernier calipers, digital micrometers, and digital indicators, and widely utilized to position moving tables or the like.

Encoders are, for example, optical encoders, capacitive encoders, and magnetic encoders. A capacitive encoder will be exemplified. Note that, an optical encoder and a magnetic encoder are essentially the same as a capacitive encoder in detection principle.

A capacitive encoder includes a main scale and a detection head that is relatively movable to the main scale and detects relative displacement to the main scale.

Generally, the main scale is a fixed element and the detection head is a movable element, but they may be inverted. A number of electrodes are disposed on the main scale and the detection head. A periodic capacity change is generated in the electrode patterns according to the relative displacement between the main scale and detection head. By extracting the signal of the periodic capacity change, the displacement is detected.

A periodic signal generated at the electrodes, that is, a phase signal is extracted. The phase signal is extracted as a periodic square wave signal CMP by performing sampling, mixing, low-frequency filtering, or binarizing. The periodic square wave signal CMP has phase information at edges thereof. A phase detection circuit outputs the phase information of the square wave signal CMP as a digital value. For example, if a loop counter counts up according to a clock and the count value is sampled at the timing of an edge of the square wave signal CMP, the phase information is extracted as a digital value. Then, by comparing the phase information with an electrode arrangement pitch, the phase information is converted into the relative displacement of the detection head.

Then, an absolute position detection type (absolute-type) displacement measuring device extracts two or more periodic signals having different periods and combines the phase information of these periodic signals to detect the absolute position.

SUMMARY OF THE INVENTION

Since an absolute position detection type (absolute-type) displacement measuring device extracts two or more periodic signals having different periods, multiple sets of a drive signal, a demodulation circuit, and a phase detection circuit are required.

If all the circuits operates while the displacement measuring device is turned on, they consume a large amount of power. Alternatively, although the power is saved, all the circuits are required to operate until the phase information about all scales of a coarse scale, a medium scale, a fine scale, and the like are acquired. Due to this circumstances, an absolute position detection type (absolute-type) displacement measuring device inevitably consumes a large amount of power.

A purpose of the present invention is to provide a displacement measuring device that minimize the power consumption and improves the power efficiency.

A displacement measuring device according to an embodiment of the present invention includes:
  a main scale;
  a detection head that is provided in such a manner as to be relatively displaceable to the main scale and outputs a periodic signal having a phase to be changed according to relative displacement to the main scale;
  a demodulator that demodulates the periodic signal into a rectangular scale signal having phase information at an edge; and
  a phase detector that detects the phase information of the scale signal at a timing of the edge, wherein
  the detection head that outputs, as the periodic signal, a first periodic signal and a second periodic signal,
  the demodulator includes:
    a first scale demodulator that demodulates the first periodic signal into a first scale signal; and
    a second scale demodulator that demodulates the second periodic signal into a second scale signal,
  the phase detector includes:
    a first phase detector that detects phase information of the first scale signal; and
    a second phase detector that detects phase information of the second scale signal,
  the first phase detector includes:
    a first sampling signal generator that outputs a first sampling signal at a timing of an edge of the first scale signal;
    a first counter that counts up a count value based on a clock pulse at certain intervals and outputs the count value at a timing designated by the first sampling signal;
    a first average calculation executor that calculates an average of a predetermined k1-number of sampling values; and
    a first scale stop command unit that outputs, when detecting the number of edges of the first scale signal reaches the k-number, a first scale detection stop command,
  the second phase detector includes:
    a second sampling signal generator that outputs a second sampling signal at a timing of an edge of the second scale signal;
    a second counter that counts up a count value based on a clock pulse at certain intervals and outputs the count value at a timing designated by the second sampling signal; and a second average calculation executor that calculates an average of a predetermined k2-number of sampling values, and when the first scale detection stop command is output from the first scale stop command unit, the first scale demodulator stops demodulating the first scale signal, and the first phase detector stops detecting the phase information of the first scale signal, where k1 and k2 are natural numbers and satisfy k1<k2.

In an embodiment of the present invention, it is preferable that the detection head includes a drive signal generation circuit, the drive signal generation circuit generates a first scale pulse train signal for generating the first periodic signal according to the relative displacement to the main scale, and a second scale pulse train signal for generating the second periodic signal according to the relative displacement to the main scale, and when the first scale detection stop command is output from the first scale stop command unit, the drive signal generation circuit stops generating the first scale pulse train signal.

In an embodiment of the present invention, it is preferable that the drive signal generation circuit includes:
a multi-drive signal supply circuit that supplies a multi-drive signal obtained by superposing the first scale pulse train signal and the second scale pulse train signal; and
a single drive signal supply circuit that supplies a single drive signal including only the second scale pulse train signal, the multi-drive signal supply circuit supplies the multi-drive signal until the first scale detection stop command is output from the first scale stop command unit, and the single drive signal supply circuit supplies the single drive signal after the first scale detection stop command is output.

BRIEF DESCRIPTION OF THE DRAWINGS

FIG. 12 is a diagram showing an example of a timing chart when coarse, medium, and fine detectors each detect a phase.

DETAILED DESCRIPTION

Figure 1:
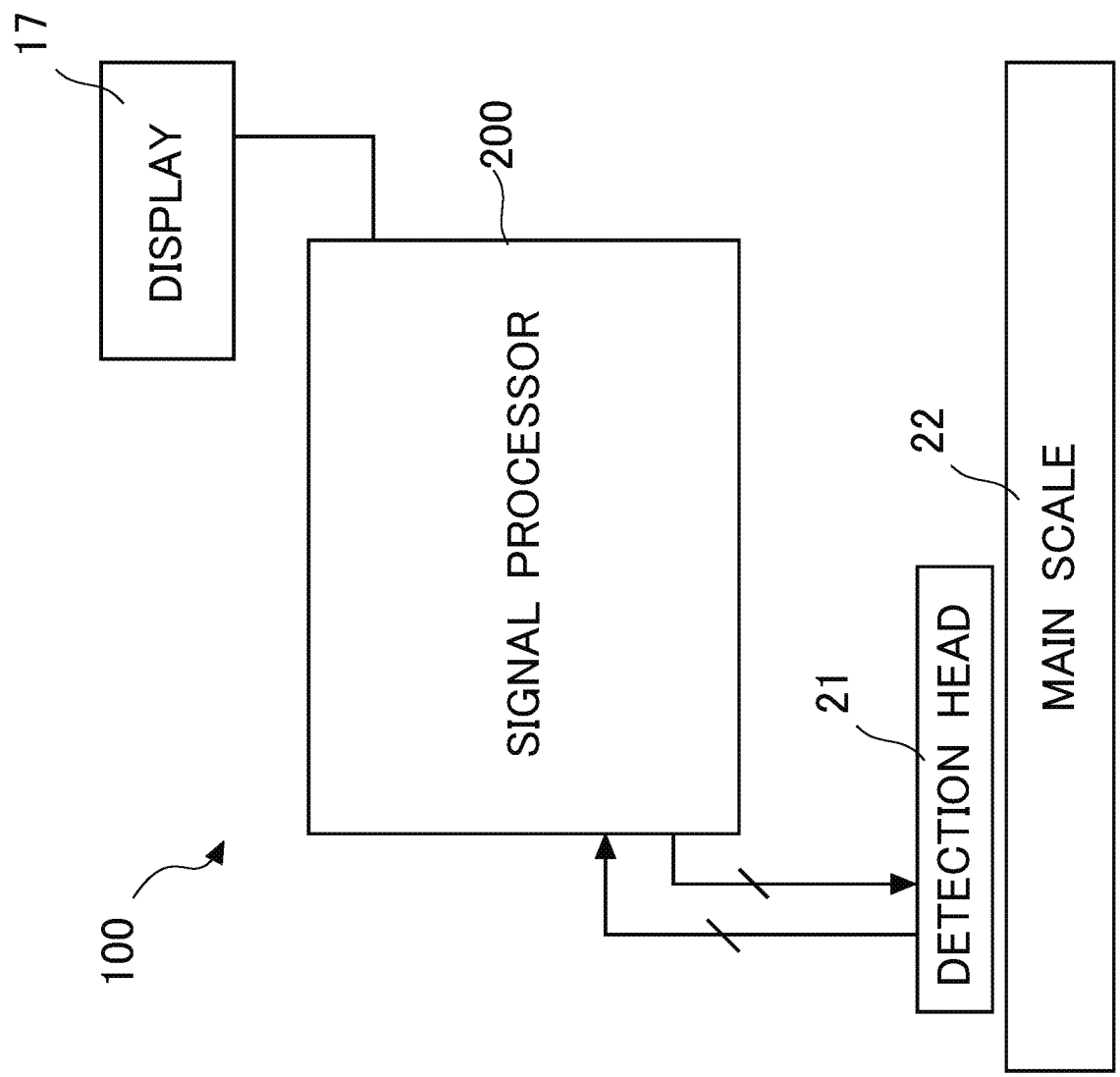
FIG. 1 is a diagram showing a configuration of an entire encoder.

An embodiment of the present invention will be described with reference to the drawings and reference signs assigned to elements in the drawings.

First Exemplary Embodiment

In the present embodiment, a displacement measuring device 100 is exemplified as an absolute-type capacitive encoder.

FIG. 1 is a diagram showing a configuration of an entire encoder 100.

The encoder 100 includes a main scale 22, a detection head 21, a signal processor 200, and a display 17.

The detection head 21 is disposed in such a manner as to face the main scale 22 with a slight gap therebetween and provided in such a manner as to movable in the longitudinal direction of the main scale 22. The longitudinal direction of the main scale 22 is assumed to be a measurement axis X direction, that is, a length measurement direction.

The main scale 22 and the detection head 21 each have an electrode pattern for position detection on the surface facing each other.

Figure 2:
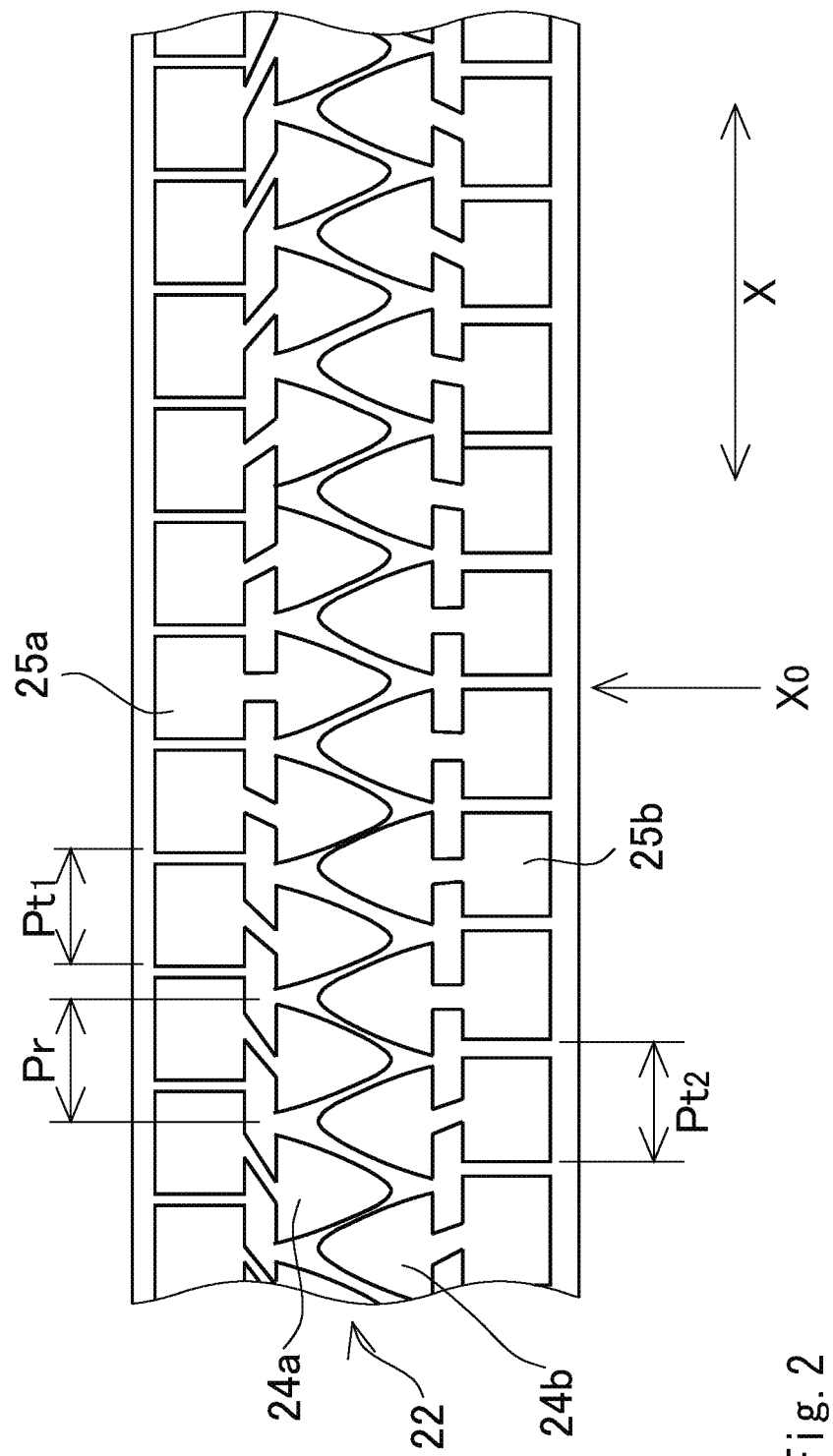
FIG. 2 is a diagram showing an electrode pattern provided on a main scale.

FIG. 2 is a diagram showing the electrode pattern provided on the main scale 22.

Figure 3:
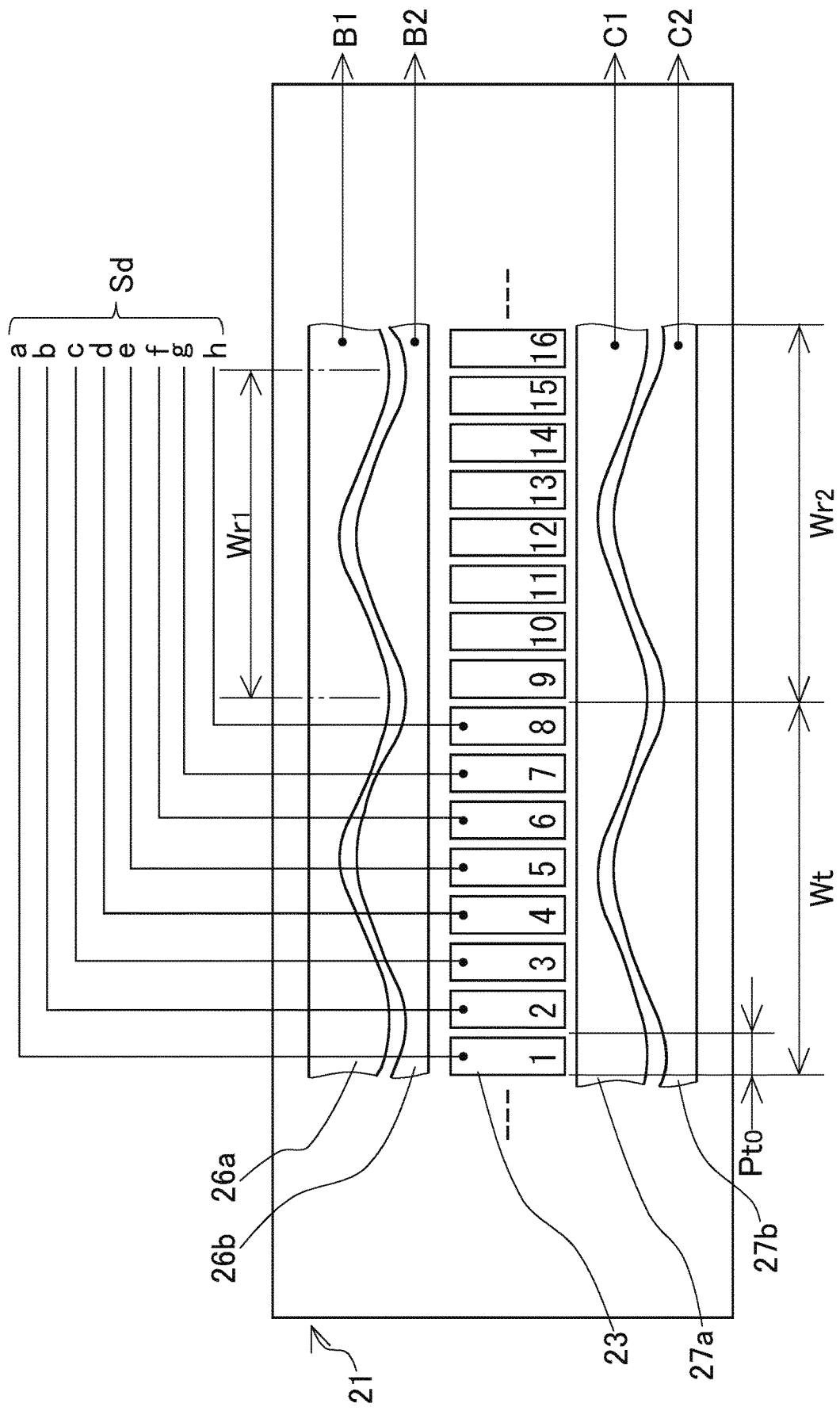
FIG. 3 is a diagram showing an electrode pattern provided on a detection head.

FIG. 3 is a diagram showing the electrode pattern provided on the detection head 21.

The main scale 22 includes first reception electrodes 24a, second reception electrodes 24b, first transmitter electrodes 25a, and second transmitter electrodes 25b.

In FIG. 2, the first reception electrodes 24a each have a downward triangular shape and are arranged along the length measurement direction (the measurement axis X direction) of the main scale 22 at a certain pitch (Pr).

Meanwhile, the second reception electrodes 24b each have an upward triangular shape and are arranged along the length measurement direction (the measurement axis X direction) of the main scale 22 at the certain pitch (Pr). The first reception electrodes 24a and the second reception electrodes 24b are disposed in such a manner as to engage each other.

The first transmitter electrodes 25a are arranged in parallel with the first reception electrodes 24a, and each first transmitter electrode 25a and each first reception electrodes 24a are connected on a one-to-one basis. The first transmitter electrodes 25a are disposed along the length measurement direction (the measurement axis X direction) of the main scale 22 at a certain pitch (Pt1).

Meanwhile, the second transmitter electrodes 25b are arranged in parallel with the second reception electrodes 24b, and each second transmitter electrode 25b and each second reception electrode 24b are connected on a one-to-one basis. The second transmitter electrodes 25b are disposed along the length measurement direction (the measurement axis X direction) of the main scale 22 at a certain pitch (Pt2).

The arrangement pitch Pt1 of the first transmitter electrodes 25a and the arrangement pitch Pt2 of the second transmitter electrodes 25b are different from the arrangement pitch Pr of the reception electrodes 24a and 24b, which will be described later.

Note that, it is assumed to be Pr>Pt2>Pt1.

Next, the electrode pattern on the detection head 21 will be described with reference to FIG. 3.

The detection head 21 includes transmission electrodes 23, a first detection electrode 26a, a first detection electrode 26b, a second detection electrode 27a, and a second detection electrode 27b.

The transmission electrodes 23 are arranged along the length measurement direction (the measurement axis X direction) at a predetermined pitch Pt0. The transmission electrodes 23 are capacitance-coupled with the first reception electrodes 24a and the second reception electrodes 24b on the main scale 22.

Here, eight transmission electrodes 23 constitute a unit (group). That is, the transmission electrodes 23 are commonly connected every seven electrodes.

For example, the first transmission electrode 23 is commonly connected with the ninth transmission electrode, skipping the second to eighth transmission electrodes and further commonly connected with the seventeenth transmission electrodes, skipping the tenth to sixteenth transmission electrodes. (The subsequent electrodes are similarly connected and the description thereof is omitted.)

In FIG. 3, the transmission electrodes are numbered to be easily counted.

The transmission electrodes are supplied with drive signals Sd.

Figure 4:
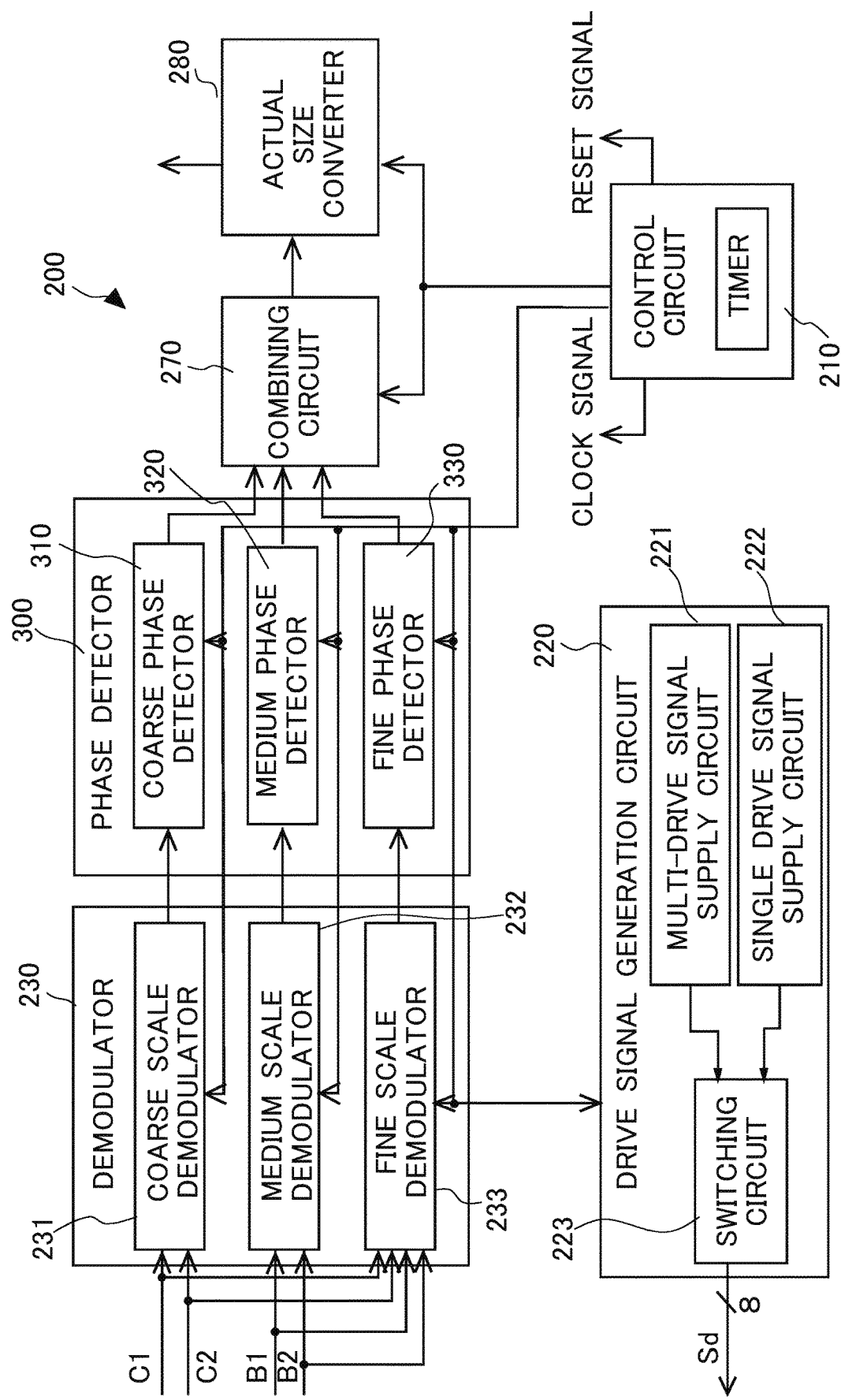
FIG. 4 is a functional block diagram of a signal processor.

As the drive signals Sd, eight-phase periodic signals a, b, . . . , and h, which are shifted from each other by 45°, are prepared. (The eight-phase periodic signals a to h are numbered as phase numbers 0 to 7 in the phase order.) Then, eight transmission electrodes constituting a group are respectively supplied with the eight-phase periodic signals a, b, . . . , and h, which are shifted from each other by 45°. The drive signals Sd are, more specifically, chopped by a high-frequency pulse and generated by a drive signal generation circuit 220 (FIG. 4).

The time change in the potential of a drive signal Sd is expressed as the following expression.

$$Vn = A \sin 2\pi\{(t/T) - (n/8)\}$$

where A represents the amplitude of the drive signal Sd, T represents a period of the drive signal Sd, and n represents a phase number (0, 1, 2, . . . , or 7).

When the drive signals Sd are supplied to the transmission electrodes 23, an electric field pattern that periodically oscillates in the arrangement direction (the measurement axes X direction) of the transmission electrodes 23 is generated. The electric field pattern has a pitch Wt eight times the pitch Pt0 of the transmission electrodes 23. The pitch Wt is set to be N times the pitch Pr of the reception electrodes 24a and 24b. (N is a positive integer.) It is preferable that N is an odd number, such as 1, 3, or 5, and it is assumed to be N=3 in the present embodiment. Thus, three or four reception electrodes 24a and 24b are necessarily capacitance-coupled with eight consecutive transmission electrodes 23. Then, (the phase of) the signal received by each of the reception electrodes 24a and 24b is to be determined by the combination of the capacitance-coupled transmission electrodes 23 and reception electrodes 24a and 24b, but is changed according to the relative position of the detection head 21 to the main scale 22.

The first detection electrode 26a and 26b are continuous sine-wave-like-shaped electrodes having a period Wr1 and disposed in such a manner as to be capacitance-coupled with the first transmitter electrodes 25a on the main scale 22. By disposing two sine-wave-like-shaped electrodes 26a and 26b, which are shifted from each other by a half period, in such a manner as to engage each other, a pair of first detection electrodes 26a and 26b is formed. The relation between the period Wr1 of the first detection electrodes 26a and 26b and the arrangement pitch Pt1 of the first transmitter electrodes 25a will be described later.

The second detection electrodes 27a and 27b are continuous sine-wave-like-shaped electrodes having a period Wr2 and disposed in such a manner as to be capacitance-coupled with the second transmitter electrodes 25b on the main scale 22. By disposing two sine-wave-like-shaped electrodes 27a and 27b, which are shifted from each other by a half period, in such a manner as to engage each other, a pair of second detection electrodes 27a and 27b is formed. The relation between the period Wr2 of the second detection electrodes 27a and 27b and the arrangement pitch Pt2 of the second transmitter electrode 25b will be described later.

In the present embodiment, it is assumed that the encoder is an absolute-type encoder and that phase change is detected at three levels: a coarse period (coarse scale), a medium period (medium scale), and a fine period (fine scale).

That is, the pitch Pt1 of the first transmitter electrodes 25a and the pitch Pt2 of the second transmitter electrodes 25b are made slightly different from the pitch Pr of the reception electrodes 24a and 24b, and the first transmitter electrodes 25a and the second transmitter electrodes 25b are to have a deflection D1 and a deflection D2 respectively with respect to the reception electrodes 24a and 24b.

The deflections D1 and D2 are represented in the function of the distance x in the measurement direction X from a reference position x0 as follows:

$$D1(x) = (Pr - Pt1)x/Pr$$

$$D2(x) = (Pr - Pt2)x/Pr$$

When the electric field pattern generated by the deflections D1 and D2 at the first and second reception electrodes 24a and 24b is transmitted to the first and second transmitter electrodes 25a and 25b, the change according to long periods $\lambda 1$ and $\lambda 2$ are added. (It is assumed a long period due to the deflection D1 is $\lambda 1$, and a long period due to the deflection D2 is $\lambda 2$.)

Then, it is assumed that the period of the first detection electrodes 26a and 26b and the period of the second detection electrodes 27a and 27b are, for example, Wr1 (=3Pt1) and Wr2 (=3Pt2) respectively. The first detection electrodes 26a and 26b and the second detection electrodes 27a and 27b are capacitance-coupled with three first transmitter electrodes 25a and three second transmitter electrodes 25b respectively, and the capacity change generated in the first transmitter electrodes 25a and the second transmitter electrodes 25b can be extracted as a detection current.

The transmission electrodes 23 are considered to be capacitance-coupled with the detection electrodes 26a, 26b, 27a, and 27b via the reception electrodes 24a and 24b and the transmitter electrodes 25a and 25b.

For example, it will be described how the capacity between one of the transmission electrodes 23 and one of the first detection electrodes (26a) is changed according to a position x. This capacity is represented by Cn(B1). The capacity Cn(B1) is expressed as the following expression.

$$Cn(B1) = B \sin 2\pi\{(x/\lambda 1) - (n/8)\} + C \sin 2\pi\{(x/Pr) - (3n/8)\} + D$$

where B is the amplitude of a long period, C is the amplitude of a short period (pr), and D is an offset value.

Similarly, it will be described how the capacity between one of the transmission electrodes 23 and the other first detection electrode (26b) is changed according to the position x.

The one first detection electrode (26a) and the other first detection electrode (26b) are shifted from each other by a half period, and the long period (λ1) has an inverted phase. This capacity is represented by Cn(B2).

The capacity Cn(B2) is expressed as the following expression.

$$Cn(B2) = -B \sin 2\pi\{(x/\lambda 1) - (n/8)\} + C \sin 2\pi\{(x/Pr) - (3n/8)\} + D$$

The capacity is the function of the position x, and which phase of the transmission electrodes 23 to be strongly coupled with the detection electrodes 26a and 26b is changed according to x.

The first detection electrodes 26a and 26b are capacitance-coupled with the transmission electrodes 23, and voltage is induced in the first detection electrodes 26a and 26b.

The change in the induced voltage is extracted as detection signals B1 and B2 and expressed as follows.

$$B1 = \Sigma_{n=0}^{7} Cn(B1) \cdot Vn$$

$$B2 = \Sigma_{n=0}^{7} Cn(B2) \cdot Vn$$

In addition, detection signals C1 and C2 detected in the second detection electrode 27a and 27b are expressed similarly.

Here, the long period (λ1) of the detection signals B1 and B2 is to be tens of times the short period (Pr). In addition, the long period (λ2) of the detection signals C1 and C2 is to be tens of times the long period (λ1) of the detection signals B1 and B2. Then, the phase displacement can be acquired at all levels of the coarse period (coarse scale), the medium period (medium scale), and the fine period (fine scale) with the following expressions:

(Coarse scale): C1−C2
(Medium scale): B1−B2
(Fine scale): (B1+B2)−(C1+C2)

The coarse scale signal, the medium scale signal, and the fine scale signal are expressed, for example, as follows:

(Coarse Scale Signal)

$$C1 - C2 = K1 \cos 2\pi(x/\lambda 2 - t/T)$$

(Medium Scale Signal)

$$B1 - B2 = K2 \cos 2\pi(x/\lambda 1 - t/T)$$

(Fine Scale Signal)

$$(B1+B2) - (C1+C2) = K3 \cos 2\pi(x/Pr - t/T)$$

Here, it is assumed that, for example, the time of the zero-crossing point of the fine scale signal is t0, and the following expressions hold.

$$2\pi(x/Pr - t0/T) = \pi/2$$

$$x = (\tfrac{1}{4} + t0/T) \cdot Pr$$

Accordingly, by counting the time from the reference time when the phase of a reference signal is 0 to the zero-crossing point t0 with a counter or the like, the position x of the detection head 21 is calculated.

The signal processor 200 will be described.

FIG. 4 is a functional block diagram of the signal processor 200.

The signal processor 200 includes a control circuit 210, a drive signal generation circuit 220, a demodulator 230, a phase detector 300, a combining circuit 270, and an actual size converter 280.

The control circuit 210 supplies each circuit with a control signal, a clock signal, a reset signal, and the like to control operation timings of the entire system.

The drive signal generation circuit 220 generates eight-phase periodic signals a, b, . . . , and h, which are shifted from each other by 45°, and supplies the signals as the drive signals Sd to the transmission electrodes 23.

The drive signal generation circuit 220 includes a multi-drive signal supply circuit 221, a single drive signal supply circuit 222, and a drive signal switching circuit 223.

In the above description, the change in the capacitive coupling between the transmission electrodes 23 and the detection electrodes (26a, 26b, 27a, and 27b) according to the position x, and the extraction of the coarse scale signal, the medium scale signal, and the fine scale signal are briefly described.

Figure 5:
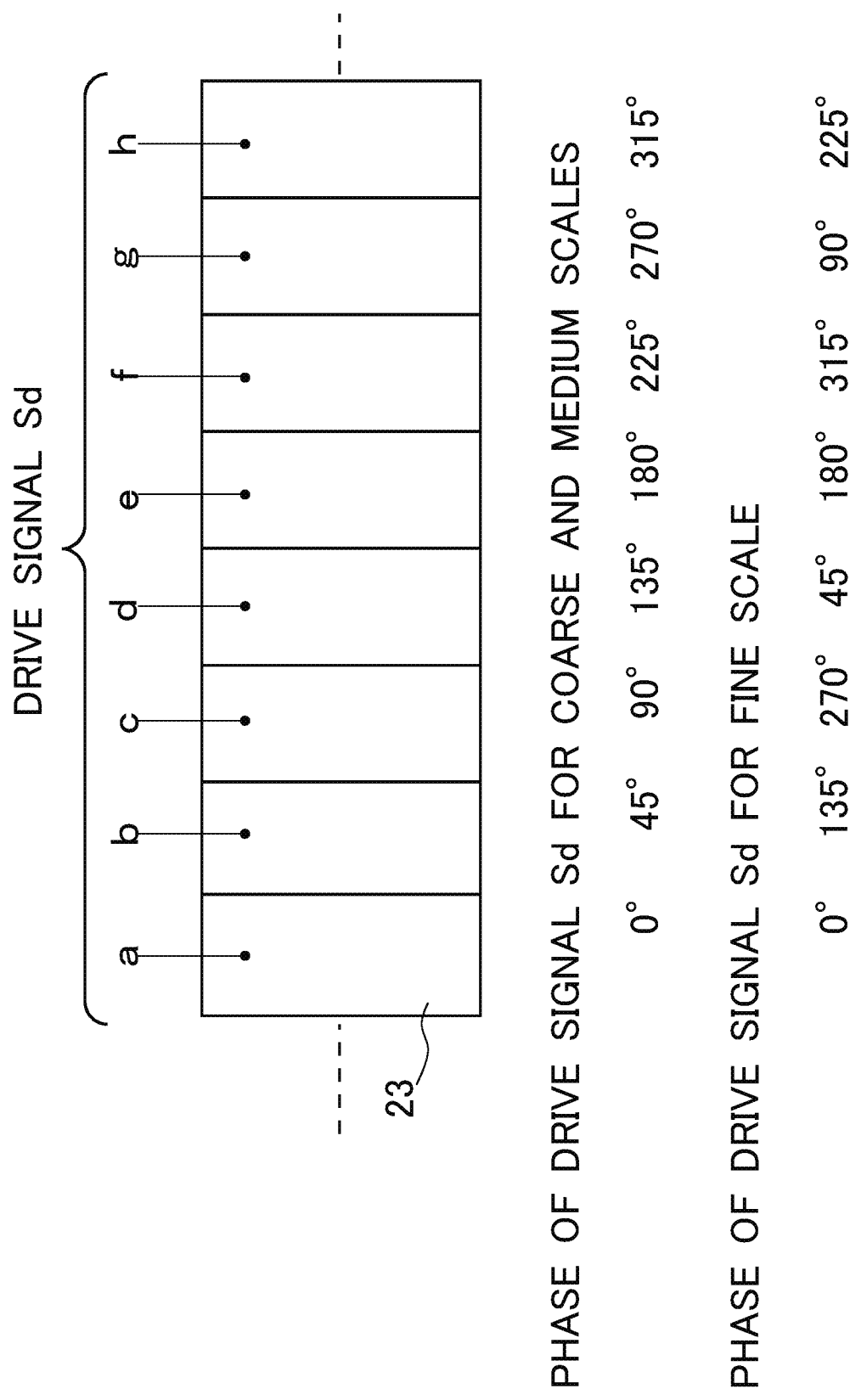
FIG. 5 is a diagram showing an example of a phase arrangement of a drive signal.

In consideration of the change in the capacitive coupling and the extraction of the scale signals, in order to supply the eight-phase periodic signals a, b, . . . , and h to eight transmission electrodes, the phases of the drive signals for extracting the coarse scale signal and the medium scale signal need to be different from the phases of the drive signals for extracting the fine scale signal. As exemplified in FIG. 5, the drive signals for extracting the coarse scale signal and the medium scale signal each have a phase shifted from the phase of the next signal by 45°. The drive signals for extracting the fine scale signal each have a phase shifted from the phase of the next signal by 135°.

The drive signal for extracting the coarse scale signal and the drive signal for extracting the medium scale signal can be commonly used, and they are collectively referred to as a coarse scale pulse train signal. The drive signal for extracting the fine scale signal is referred to as a fine scale pulse train signal.

The multi-drive signal supply circuit 221 generates a multi-drive signal by superposing the coarse scale pulse train signal and the fine scale pulse train signal.

Figure 6:
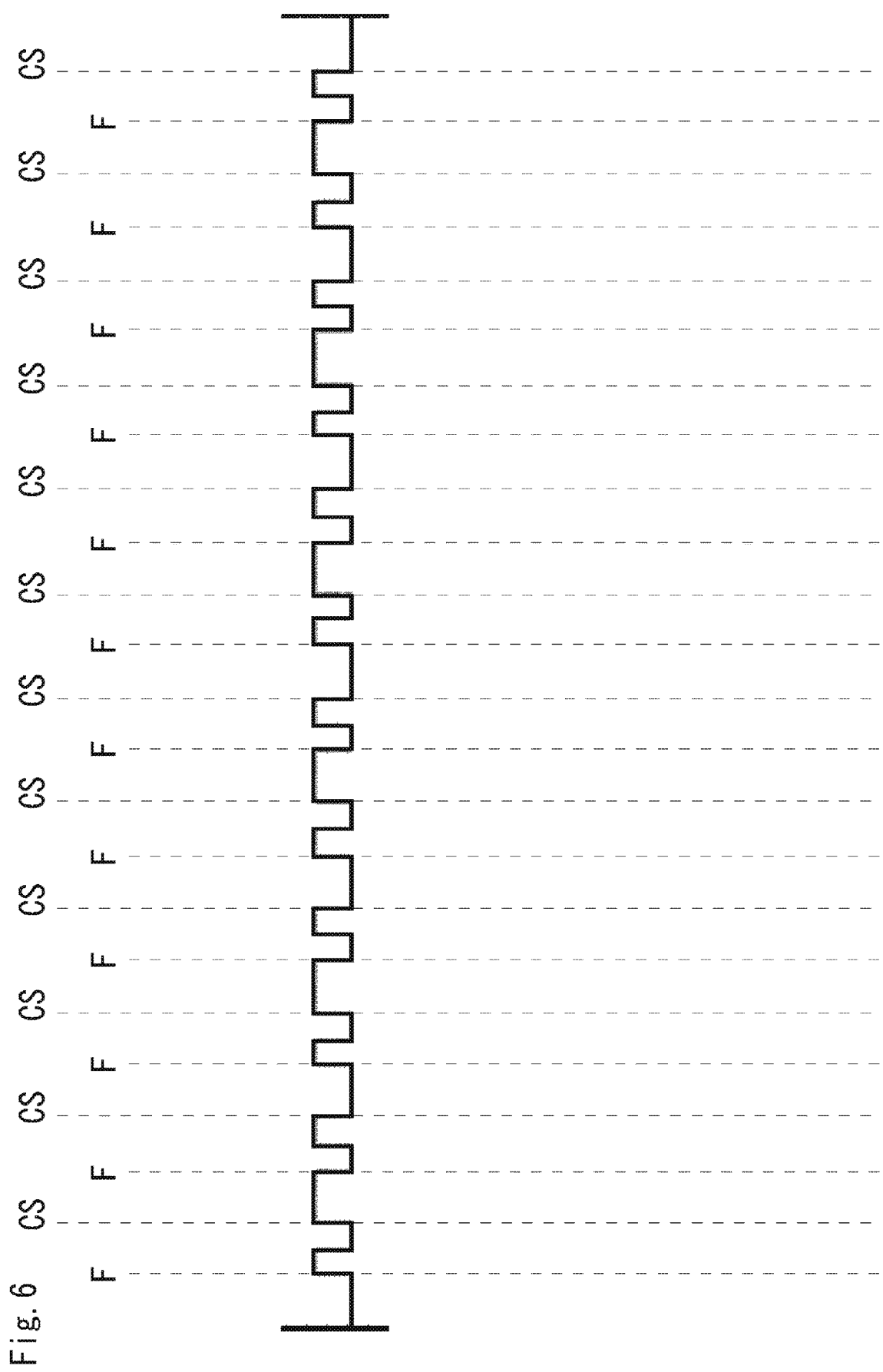
FIG. 6 is a diagram showing an example of a multi-drive signal.

FIG. 6 shows an example of the multi-drive signal.

The important matter for the coarse scale pulse train signal and the fine scale pulse train signal is the position (phase) of the edge. The multi-drive signal is a pulse train signal including both the edges of the coarse scale pulse train signal and the edges of the fine scale pulse train signal. In FIG. 6, CS represents each edge of the coarse scale pulse train signal, and F represents each edge of the fine scale pulse train signal.

The single drive signal supply circuit 222 generates a single drive signal including only the fine scale pulse train signal.

Figure 7:
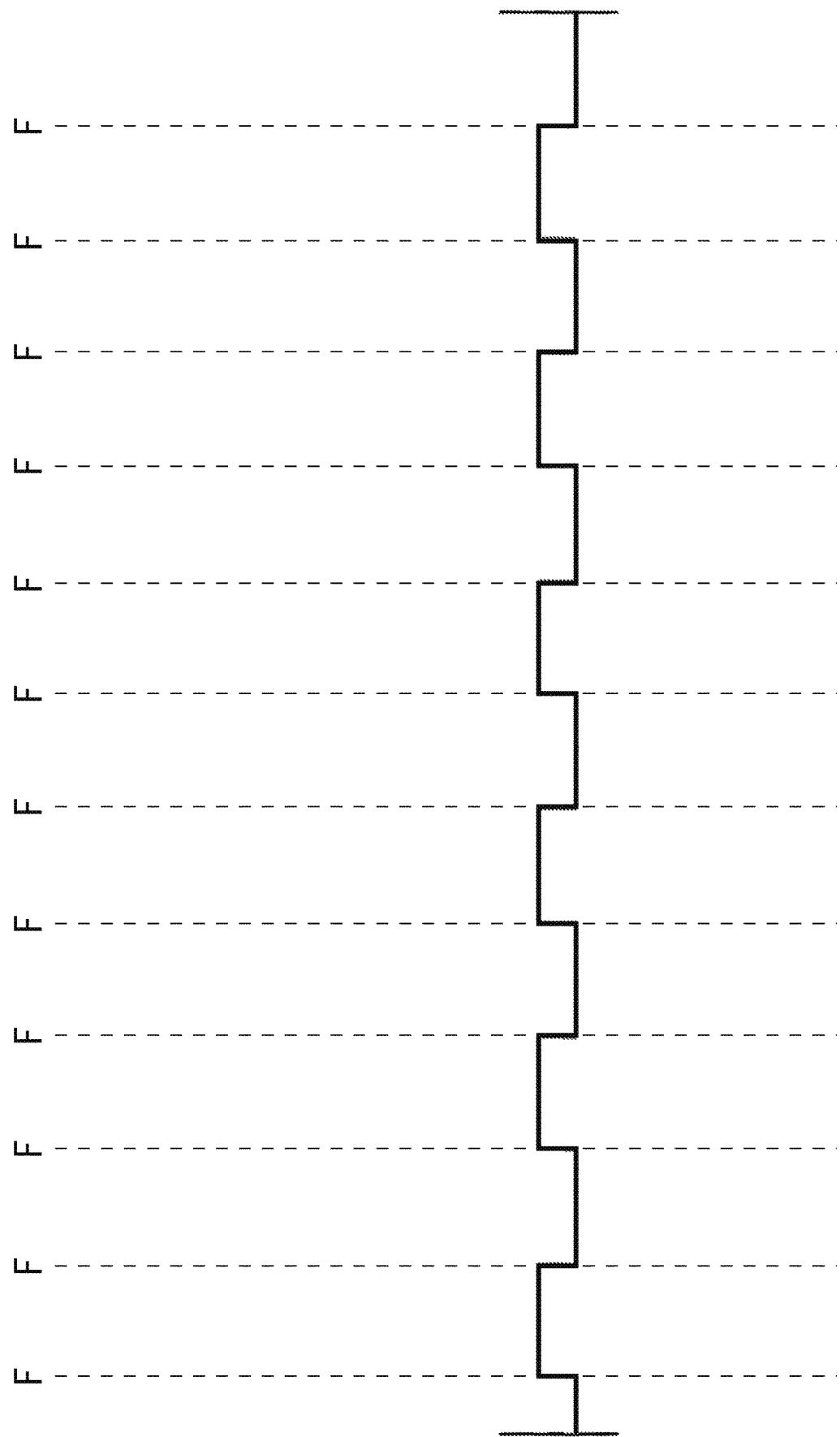
FIG. 7 is a diagram showing an example of a single drive signal.

FIG. 7 shows an example of the single drive signal. That is, the single drive signal is a pulse train signal including only the edges of the fine scale pulse train signal.

The drive signal switching circuit 223 switches between the multi-drive signal from the multi-drive signal supply circuit 221 and the single drive signal from the single drive signal supply circuit 222 and outputs them.

When the drive signal generation circuit 220 is started in response to the start signal from the control circuit 210, the drive signal switching circuit 223 firstly selects and outputs the multi-drive signal from the multi-drive signal supply circuit 221. Then, when receiving both a coarse scale detection stop signal and a medium scale detection stop signal (these scale detection stop signals will be described later), the drive signal switching circuit 223 switches to and outputs the single drive signal from the single drive signal supply circuit 222. Furthermore, when receiving a fine scale detection stop signal (this scale detection stop signal will be described later), the drive signal generation circuit 220 stops operating, that is, the multi-drive signal supply circuit 221 and the single drive signal supply circuit 222 stop operating.

Note that, the coarse scale detection stop signal, the medium scale detection stop signal, the fine scale detection stop signal will be described later.

Here, since the drive signal generation circuit 220 does not output the single drive signal but outputs the multi-drive signal when the drive signal generation circuit 220 is started in response to the start signal, it can be possible that only the multi-drive signal supply circuit 221 is started firstly and that the single drive signal supply circuit 222 remains stopped. Then, it can be further possible that the single drive signal supply circuit 222 is started at the timing when the multi-drive signal is switched to the single drive signal.

However, starting a drive signal supply circuit (the multi-drive signal supply circuit 221 or the single drive signal supply circuit 222) can take time a bit, and tuning the drive signal supply circuit itself on and off can rather consume a larger amount of power. For these reasons, instead of turning the drive signal supply circuit (the multi-drive signal supply circuit 221 or the single drive signal supply circuit 222) on and off, the switching circuit 223 switches the output signal from the drive signal generation circuit 220 between the multi-drive signal and the single drive signal. With this configuration, the up and down of a signal (the number of edges) is reduced when the signal is switched to the single drive signal, and power consumption is reduced accordingly.

The demodulator 230 includes a coarse scale demodulator 231, a medium scale demodulator 232, and a fine scale demodulator 233.

To the coarse scale demodulator 231, the detection signals C1 and C2 from the second detection electrodes 27a and 27b are input. Thus, the coarse scale demodulator 231 demodulates the coarse scale signal obtained from "C1–C2".

To the medium scale demodulator 232, the detection signals B1 and B2 from the first detection electrodes 26a and 26b are input. Thus, the medium scale demodulator 232 demodulates the medium scale signal obtained from "B1–B2".

To the fine scale demodulator 233, the detection signals B1 and B2 from the first detection electrodes 26a and 26b and the detection signals C1 and C2 from the second detection electrodes 27a and 27b are input. Thus, the fine scale demodulator 233 demodulates the fine scale signal obtained from "(B1+B2)–(C1+C2)".

Specifically, in the demodulation, sampling, mixing, low-frequency filtering, or binarizing is performed at a transmission-waveform chop frequency. Thus, rectangular period signals CMP having phase information at the edge are generated.

In other words, a coarse scale signal (CMP-COA), a medium scale signal (CMP-MED), and a fine scale signal (CMP-FIN) are obtained.

The phase detector 300 includes a coarse phase detector 310, a medium phase detector 320, and a fine phase detector 330.

The coarse scale signal (CMP-COA) is input to the coarse phase detector 310.

The medium scale signal (CMP-MED) is input to the medium phase detector 320.

The fine scale signal (CMP-FIN) is input to the fine phase detector 330.

The phase detector 300 is described below. The coarse phase detector 310, the medium phase detector 320, and the fine phase detector 330 have basically the same configuration, and the coarse phase detector 310 is exemplified.

Figure 8:
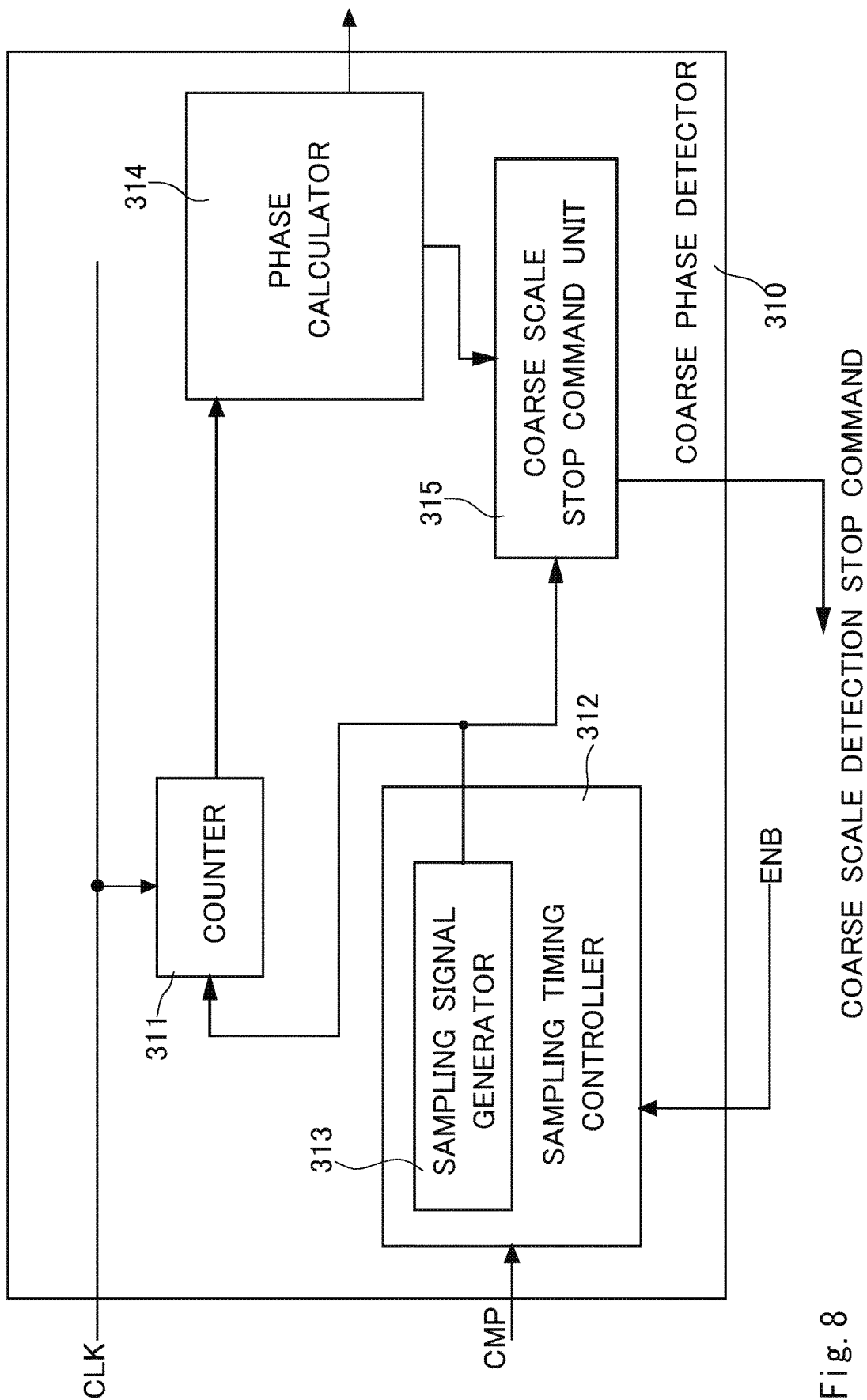
FIG. 8 is a functional block diagram of a coarse phase detector.

FIG. 8 is a functional block diagram of the coarse phase detector 310.

The coarse phase detector 310 includes a counter 311, a sampling timing controller 312, a phase calculator 314, and a coarse scale stop command unit 315.

The counter 311 is a loop counter and counts up according to the clock pulse. For example, when the control circuit 210 generates a start signal at predetermined intervals (for example, at 100 msec intervals), the drive signal generation circuit 220, the demodulator 230, and the phase detector 300 start operating in response to the start signal. That is, in response to the start signal, the drive signal generation circuit 220 generates the drive signal Sd, and a counter 331 starts to count up from zero. Thus, the counter 311 synchronizes with the reference signal Sd0 having the phase number 0 (the periodic signal a). The count value is output to the phase calculator 314.

To the sampling timing controller 312, the coarse scale signal (CMP-COA) from the coarse scale demodulator 231 and the enable signal ENB from the control circuit 210 at 100 msec intervals are input. The sampling timing controller 312 instructs, based on the coarse scale signal (CMP-COA) and the enable signal ENB, the counter 311 to output the count value.

Figure 9:
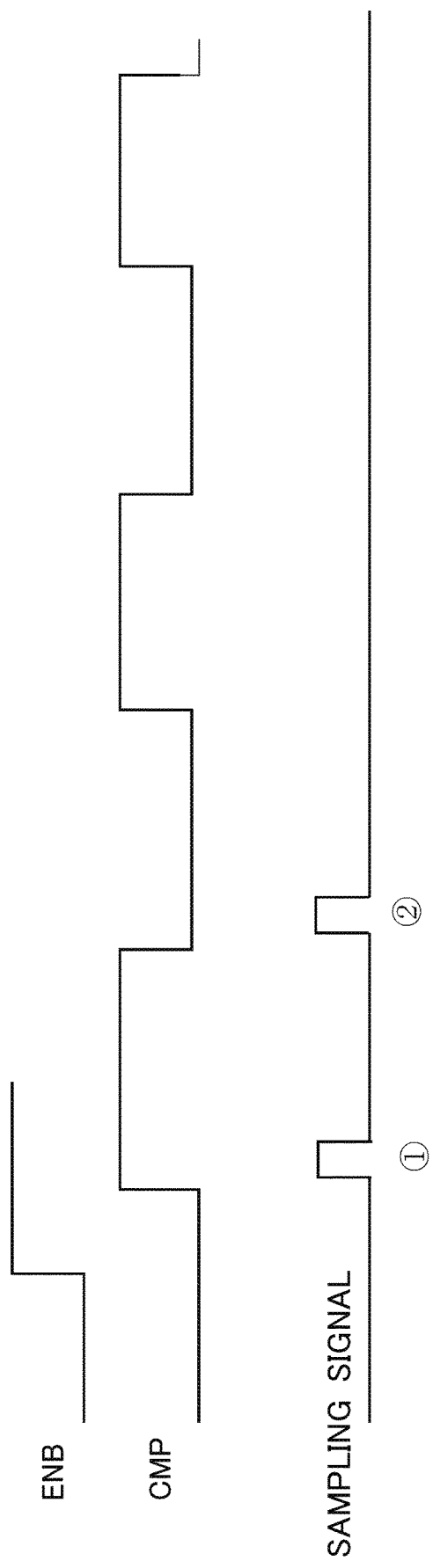
FIG. 9 is a diagram showing that a sampling signal rises at timings of edges of a coarse scale signal.

The sampling timing controller 312 includes a sampling signal generator 313. FIG. 9 shows that a sampling signal rises at the edge timings of the coarse scale signal (CMP-COA).

To the sampling signal generator 313, the enable signal ENB from the control circuit 210 and the coarse scale signal (CMP-COA) from the coarse scale demodulator 231 are input. The sampling signal generator 313 generates, after the enable signal ENB rises, a sampling signal that rises twice at the edge timings of the coarse scale signal (CMP-COA).

Here, it is assumed that the generation of the sampling signal is started at the first rising edge of the coarse scale signal (CMP-COA) after the enable signal ENB rises. However, if the phase can be adjusted, the edge is determined to be a rising edge or a falling edge, and then the generation of the sampling signal may be started at the first rising edge of the coarse scale signal (CMP-COA) after the enable signal ENB rises. This has been detailedly described in Japanese patent application No. 2015-007660.

In order to detect the phase of the coarse scale signal, the average value obtained by averaging two (k1-number of) sampling values is used as the phase information, and the sampling signal is set to rise twice. For example, when the average value is calculated from four (k2-number of) sampling values to detect the phase of the fine scale signal (CMP-FIN), the sampling signal needs to rise four times.

The sampling signal generated in this manner is supplied to the counter 311. The counter 311 outputs the count value at the timing of the sampling signal.

The phase calculator 314 calculates, based on a plurality of (here, two) count values obtained from the counter 311, the phase (average phase) of the coarse scale signal (CMP-COA).

When confirming that the sampling signal from the sampling signal generator 313 has risen predetermined times (for example, twice) and that the phase calculator 314 has calculated the average phase from the two count values, the coarse scale stop command unit 315 outputs a coarse-scale detection stop command. When the coarse scale detection stop command is output, the coarse phase detector 310 and the coarse scale demodulator 231 stop operating.

Figure 10:
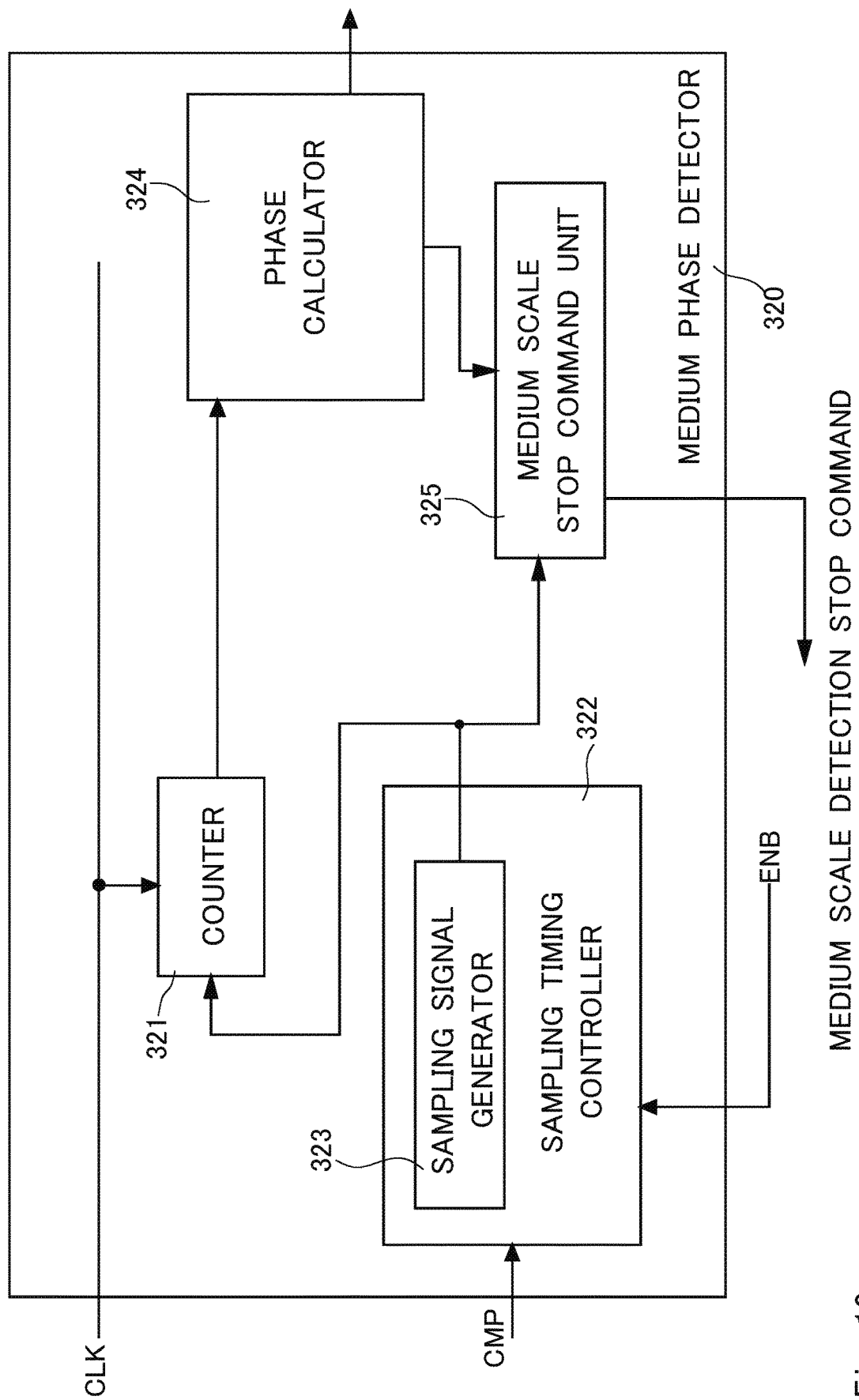
FIG. 10 is a functional block diagram of a medium phase detector.

Next, FIG. 10 is a functional block diagram of the medium phase detector 320.

The configuration of the medium phase detector 320 is substantially the same as the configuration of the coarse phase detector 310. The medium phase detector 320 includes a medium scale stop command unit 325. When confirming that the sampling signal from the sampling signal generator 323 has risen predetermined times (for example, twice) and that a phase calculator 324 has calculated the average phase from the two count values, the medium scale stop command unit 325 outputs a medium scale detection stop command. When the medium scale detection stop command is output, the medium phase detector 320 and the medium scale demodulator 232 stop operating.

In addition, the coarse scale detection stop signal and the medium scale detection stop signal are also supplied to the drive signal generation circuit 220 as described above. When the drive signal generation circuit 220 receives both the coarse scale detection stop signal and the medium scale detection stop signal, the drive signal switching circuit 223 switches to and outputs the single drive signal from the single drive signal supply circuit 222.

Figure 11:
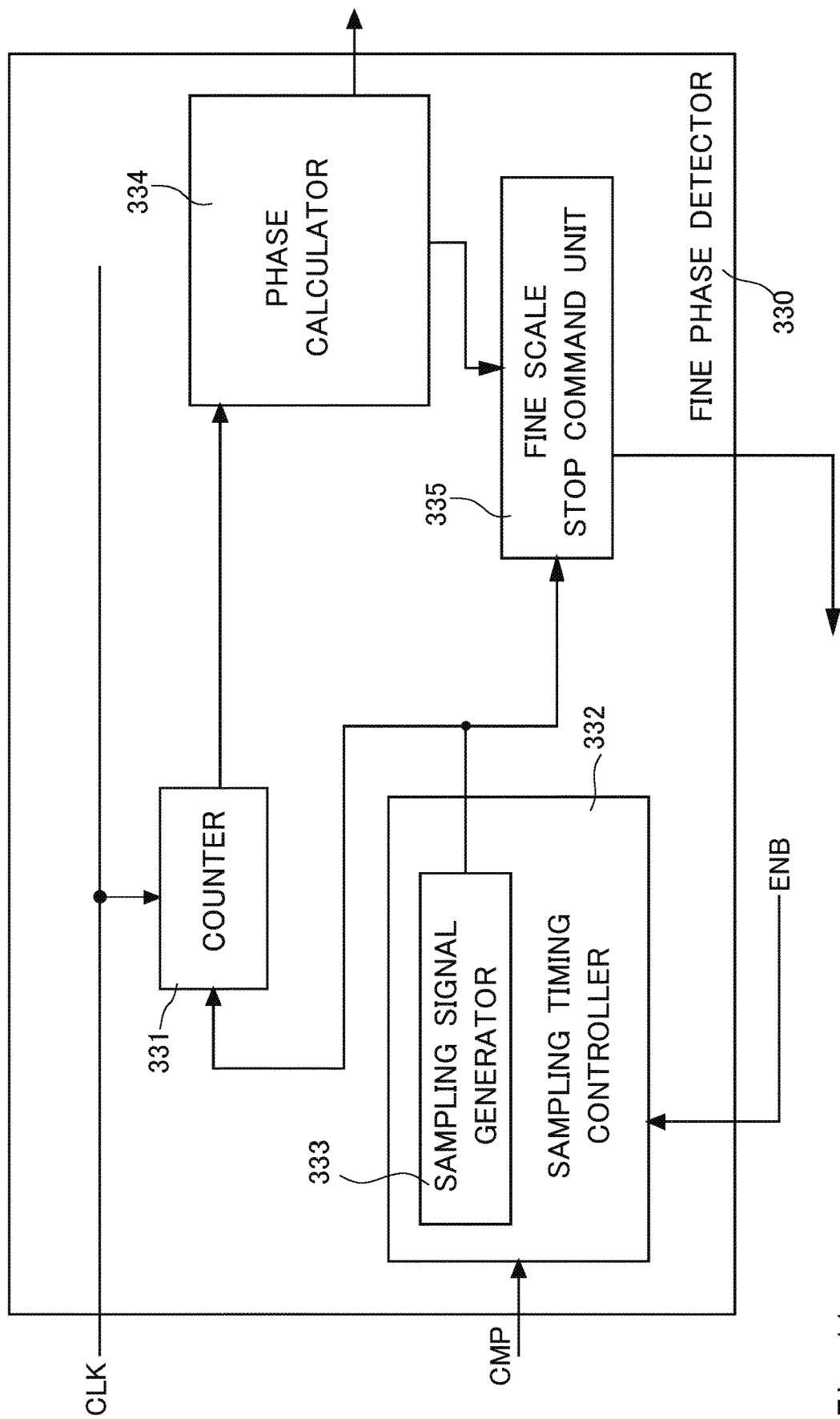
FIG. 11 is a functional block diagram of a fine phase detector.

Next, FIG. 11 is a functional block diagram of the fine phase detector 330.

The configuration of the fine phase detector 330 is substantially the same as the configuration of the coarse phase detector 310. However, a sampling signal generator 333 of the fine phase detector 330 generates, after the enable signal ENB rises, a sampling signal that rises four (k2-number of) times at the edge timings of the fine scale signal (CMP-FIN). That is, in the fine phase detector 330, the phase (average phase) of the fine scale signal (CMP-FIN) is calculated from four count values (four pieces of phase information).

When confirming that the sampling signal from the sampling signal generator 333 has risen predetermined times (for example, four times) and that a phase calculator 334 has calculated the average phase from four count values, a fine scale stop command unit 335 outputs a fine scale detection stop command. When the fine scale detection stop command is output, the entire phase detector 300, the entire demodulator 230, and the entire drive signal generation circuit 220 stop operating and are in a sleep state until the next start signal is generated.

FIG. 12 shows an example of a timing chart when the coarse, medium, and fine phase detectors 310, 320, and 330 detect a phase.

After the enable signal ENB rises, each of the phase detectors 310, 320, and 330 acquires a predetermined number of pieces of phase information (a predetermined number of count values of the counter) at edge timings of each scale signal CMP. The coarse and medium phase detectors 310 and 320 acquires two pieces of phase information (two count values of the counter), and the fine phase detector 330 acquires four pieces of phase information (four count values of the counter).

In the case of FIG. 12, the medium phase detector 320 completes acquiring two pieces of phase information at time t1. Then, the medium scale stop command unit 325 outputs a medium scale detection stop command. Due to the medium scale detection stop command, the medium phase detector 320 and the medium scale demodulator 232 stop operating.

Next, the coarse phase detector 310 completes acquiring two pieces of phase information at time t2. Then, the coarse scale stop command unit 315 outputs a coarse scale detection stop command. Due to the coarse scale detection stop command, the coarse phase detector 310 and the coarse scale demodulator 231 stop operating. At this time, since both the coarse scale detection stop command and the medium scale detection stop command have been output, the drive signal generation circuit 220 switches the multi-drive signal to the single drive signal.

Then, the fine phase detector 330 completes acquiring four pieces of phase information at the time t3. Then, the fine scale stop command unit 335 outputs a fine scale detection stop command. Due to the fine scale detection stop command, the fine phase detector 330 and the fine scale demodulator 233 stop operating, that is, the phase detector 300 and the demodulator 230 stop operating. In addition, due to the fine scale detection stop command, the drive signal generation circuit 220 stop outputting the single drive signal, that is, the drive signal generation circuit 220 stops operating.

Each phase information calculated by each of the phase detectors 310 to 330 is weighted and combined by the combining circuit 270. The output from the combining circuit 270 is converted into the actual size value by the actual size converter 280. The actual size value obtained by the actual size converter 280 is displayed on the display 17.

With the above configuration in the present embodiment, the following effects are obtained.

Conventionally, while a displacement measuring device is turned on, all the circuits operate and consume a large amount of power. Alternatively, although the power is saved, all the circuits operate until the phase information about all scales of a coarse scale, a medium scale, and a fine scale.

In contrast, the operation of a circuit relating to a track (scale) about which the phase information has been acquired is stopped in the present embodiment. In addition, the drive signal generation circuit 220 includes not only the multi-drive signal supply circuit 221 but also the single drive signal supply circuit 222 and is capable of switching to a single drive signal when a multi-drive signal is unnecessary. Thus, it is possible to minimize unnecessary power consumption and improve the power efficiency.

Note that, the present invention is not limited to the above embodiment and can be appropriately modified without departing from the spirit.

The applicable range of the present invention is not limited to a capacitive encoder or a linear movement type encoder. As long as the encoder is capable of calculating an absolute position based on phase information, the present invention may be applied to a photoelectric or magnetic encoder as well as a rotary encoder.

In the above embodiment, the fine phase detector 330 is set in such a manner as to calculate the average value of four (k2-number of) count values (four pieces of phase information), and the coarse phase detector 310 and the medium phase detector 320 are set in such a manner as to calculate two (k1-number of) count values (two pieces of phase information). (That is, k2≥k1+2).

In this case, the coarse phase detector 310 and the medium phase detector 320 necessarily complete acquiring necessary phase information before the fine phase detector 330 completes acquiring. In other words, by the time when a fine scale detection stop command is output, the coarse phase detector 310 and the medium phase detector 320 have completed acquiring necessary phase information. Thus, when the fine scale detection stop command is output, the entire phase detector 300, the entire demodulator 230, and the entire drive signal generation circuit 220 may stop operating.

However, each of the fine phase detector 330, the coarse phase detector 310, and the medium phase detector 320 is appropriately set to calculate the average phase from how many count values (phase information), and it can be unknown which phase detector (310, 320, or 330) necessarily completes acquiring lastly. In this case, the related operation (demodulation, phase detection) is stopped in order from a phase detector that completes detecting the phase. Then, when both coarse and medium scale detection stop commands are output before a fine scale detection stop command is output, the drive signal is switched. When the three stop commands (the coarse, medium, and fine scale detection stop commands) are output, the drive signal generation circuit 220 stops operating.

In the above embodiment, the number of pieces of phase information (the number of count values of the counter) used to calculate the average phase in the coarse phase detection is less than that in the fine phase detection. In other words, four pieces (k2-number) of phase information are used by the fine phase detector, and two pieces (k1-number) of phase information are used by the coarse phase detector.

Naturally, the numbers used by the fine phase detector and the number used by the coarse phase detector may be inverted. That is, the number of pieces of phase information (count values of the counter) used to calculate the average phase in the fine phase detection may be less than that in the coarse phase detection. In other words, four pieces (k2-number) of phase information may be used by the coarse phase detector, and two pieces (k1-number) of phase information may be used by the fine phase detector.

17 Display
21 Detection head
22 Main scale
23 Transmission electrode
24a First reception electrode
24b Second reception electrode
25a First transmitter electrode
25b Second transmitter electrode
26a, 26b First detection electrode
27a, 27b Second detection electrode
100 Displacement measuring device (encoder)
200 Signal processor
210 Control circuit
220 Drive signal generation circuit
221 Multi-drive signal supply circuit
222 Single drive signal supply circuit
223 Drive signal switching circuit
230 Demodulator
231 Coarse scale demodulator
232 Medium scale demodulator
233 Fine scale demodulator
270 Combining circuit
280 Actual size converter
300 Phase detector
310 Coarse phase detector
311 Counter
312 Sampling timing controller
313 Sampling signal generator
314 Phase calculator
315 Coarse scale stop command unit
320 Medium phase detector
323 Sampling signal generator
324 Phase calculator
325 Medium scale stop command unit
330 Fine phase detector
331 Counter
333 Sampling signal generator
334 Phase calculator
335 Fine scale stop command unit

The invention claimed is:
1. A displacement measuring device comprising:
a main scale;
a detection head provided in such a manner as to be relatively displaceable to the main scale and configured to output a periodic signal having a phase to be changed according to relative displacement to the main scale;
a demodulator configured to demodulate the periodic signal into a rectangular scale signal having phase information at an edge; and
a phase detector configured to detect the phase information of the scale signal at a timing of the edge, wherein
the detection head is configured to output, as the periodic signal, a first periodic signal and a second periodic signal,
the demodulator comprises:
a first scale demodulator configured to demodulate the first periodic signal into a first scale signal; and
a second scale demodulator configured to demodulate the second periodic signal into a second scale signal,
the phase detector comprises:
a first phase detector configured to detect phase information of the first scale signal; and
a second phase detector configured to detect phase information of the second scale signal,
the first phase detector comprises:
a first sampling signal generator configured to output a first sampling signal at a timing of an edge of the first scale signal;
a first counter configured to count up a count value based on a clock pulse at certain intervals and to output the count value at a timing designated by the first sampling signal;
a first average calculation executor configured to calculate an average of a predetermined k1-number of sampling values; and
a first scale stop command unit configured to output, when detecting the number of edges of the first scale signal reaches the k1-number, a first scale detection stop command,
the second phase detector comprises:
a second sampling signal generator configured to output a second sampling signal at a timing of an edge of the second scale signal;
a second counter configured to count up a count value based on a clock pulse at certain intervals and to output the count value at a timing designated by the second sampling signal; and
a second average calculation executor configured to calculate an average of a predetermined k2-number of sampling values, and
when the first scale detection stop command is output from the first scale stop command unit, the first scale demodulator is configured to stop demodulating the first scale signal, and the first phase detector is configured to stop detecting the phase information of the first scale signal,
where k1 and k2 are natural numbers and satisfy k1<k2.

2. The displacement measuring device according to claim 1, wherein
the detection head comprises a drive signal generation circuit,
the drive signal generation circuit is configured to generate a first scale pulse train signal for generating the first periodic signal according to the relative displacement to the main scale, and a second scale pulse train signal for generating the second periodic signal according to the relative displacement to the main scale, and
when the first scale detection stop command is output from the first scale stop command unit, the drive signal generation circuit is configured to stop generating the first scale pulse train signal.

3. The displacement measuring device according to claim 2, wherein
the drive signal generation circuit comprises:
a multi-drive signal supply circuit configured to supply a multi-drive signal obtained by superposing the first scale pulse train signal and the second scale pulse train signal; and
a single drive signal supply circuit configured to supply a single drive signal including only the second scale pulse train signal,
the multi-drive signal supply circuit is configured to supply the multi-drive signal until the first scale detection stop command is output from the first scale stop command unit, and
the single drive signal supply circuit is configured to supply the single drive signal after the first scale detection stop command is output.

* * * * *